US012771332B2

(12) United States Patent
Wong et al.

(10) Patent No.: US 12,771,332 B2
(45) Date of Patent: Oct. 20, 2026

(54) FAST-SETTLING DELAY LINE ASSISTED BY REPLICA DELAY LINE

(71) Applicant: Silicon Laboratories Inc., Austin, TX (US)

(72) Inventors: Tak Ying Wong, Singapore (SG); Pio Balmelli, Arogno (CH); Yun Da Bryan Seah, Singapore (SG); Hua Beng Chan, Singapore (SG)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 18/738,162

(22) Filed: Jun. 10, 2024

(65) Prior Publication Data

US 2025/0379567 A1 Dec. 11, 2025

(51) Int. Cl.
*H03K 5/133* (2014.01)
*H03K 5/131* (2014.01)

(52) U.S. Cl.
CPC ............ *H03K 5/133* (2013.01); *H03K 5/131* (2013.01)

(58) Field of Classification Search
CPC ........ H03K 5/133; H03K 5/131; H03K 5/134; H03K 5/15026; H03K 5/15033; H03K 5/1504; H03K 5/15046; H03K 5/1508; H03K 5/14
See application file for complete search history.

(56) References Cited

U.S. PATENT DOCUMENTS

| | | | |
|---|---|---|---|
| 7,425,858 B1 | 9/2008 | Daga | |
| 8,378,724 B2 | 2/2013 | David et al. | |
| 8,456,242 B2 | 6/2013 | Fernald | |
| 8,467,483 B2 | 6/2013 | Vishakhadatta et al. | |
| 9,024,667 B1 | 5/2015 | Fu | |
| 12,334,938 B2 * | 6/2025 | Agrawal | H03L 7/0818 |
| 2002/0196061 A1 * | 12/2002 | Atyunin | H03L 7/07 327/158 |
| 2008/0132195 A1 | 6/2008 | Maxim et al. | |
| 2010/0167684 A1 | 7/2010 | Kerth | |
| 2013/0208832 A1 | 8/2013 | Kerth et al. | |
| 2015/0187437 A1 | 7/2015 | Schreiber et al. | |
| 2016/0179186 A1 | 6/2016 | Toh et al. | |

OTHER PUBLICATIONS

Blanchard, J., "QSPI NOR Flash Part 3—The Quad SPI Protocol," JBLopen Embedded Software Insight, Apr. 29, 2021, downloaded from jblopen.com on Apr. 23, 2024, 14 pages.

(Continued)

*Primary Examiner* — Jung Kim
(74) *Attorney, Agent, or Firm* — Zagorin Cave LLP

(57) ABSTRACT

A fast-settling delay line having a reduced or negligible delay variation in response to enabling the delay line includes a replica load coupled to a control node of a main delay line before a first edge of a clock input to the main delay line. The replica load is equivalent to the load on the control node introduced by the main delay line in response to the first edge of the clock input to the main delay line. In an embodiment, the replica delay line receives a replica clock signal that has the same frequency as the clock input to the main delay line. After a few cycles of the replica clock signal, the control voltage is stable and control logic switches off the replica delay line and turns on the main delay line.

20 Claims, 7 Drawing Sheets

(56) References Cited

OTHER PUBLICATIONS

Maneatis, J., “Low-Jitter and Process-Independent DLL and PLL Based on Self-Biased Techniques,” IEEE International Solid State Circuits Conference, Feb. 9, 1996, pp. 130-131 and 430.
Rehman, S., et al., “A 0.2-1.3 ns Range Delay-Control Scheme for a 25 Gb/s Data-Receiver Using a Replica Delay-Line-Based Delay-Locked-Loop in 45-nm CMOS,” IEEE Transactions on Circuits and Systems-II: Express Briefs, vol. 67, No. 5, May 2020, pp. 806-810.
Arasan, “Understanding Serial Peripheral Interface (SPI) Standards: A Comprehensive Overview,” Jun. 27, 2023, downloaded from arasan.com/blog/ on Apr. 23, 2024, 6 pages.

* cited by examiner

FAST-SETTLING DELAY LINE ASSISTED BY REPLICA DELAY LINE

BACKGROUND

Field of the Invention

This invention relates to integrated circuits and more particularly to integrated circuits including a delay line.

Description of the Related Art

A Serial Peripheral Interface (SPI) is commonly used for communication between integrated circuit devices, e.g., microcontrollers and peripheral devices such as sensors, displays, memory chips, and other low to moderate data rate devices. A conventional SPI uses a simple, full-duplex, synchronous communication protocol to facilitate the exchange of data between the integrated circuit devices. The conventional SPI uses separate clock (e.g., Serial Clock (CLK)) and data lines (e.g., Main In, Sub Out (MISO) and Main Out, Sub In (MOSI)). It allows for multiple subnodes (e.g., peripheral devices) to be coupled to a single main node (e.g., microcontroller), enabling effective communication in various applications. The conventional SPI operates in a master-slave configuration, with the main node controlling the clock and data transfer between the main node and one or more subnodes.

An exemplary SPI uses one or more data lines (e.g., Subnode IO terminals SIO0-SIO3) for data transfer. The use of parallel data lines (e.g., in Dual SPI (DSPI) or Quad SPI (QSPI)) allows for faster data transfer rates and supports higher clock frequencies as compared to traditional SPI. A main node uses a Chip Select (CS) signal to start and end data transfer, samples data using the rising edge of SCLK, and shifts data out on the falling edge in standard SPI mode. Each Subnode IO (SIO) terminal is a serial data input pin for command, address, and data from the main node.

In an exemplary application, a microcontroller is configured as a main node that uses an SPI to read an external memory that is configured as a subnode. The external memory receives the SCLK from the microcontroller and outputs data on the SIO terminal at a positive edge of SCLK. However, a substantial delay occurs between SCLK on the microcontroller to data received by the microcontroller on SIO. That delay can cause the microcontroller to sample data at a time that causes errors in the sampled data. Accordingly, techniques that compensate for the delay between a sample clock signal in a main node and data received by the main node are desired.

SUMMARY OF EMBODIMENTS OF THE INVENTION

In at least one embodiment, a method for stabilizing delay provided by a delay line includes, prior to driving a main delay line to generate a delayed version of an input clock signal, loading a control node of the delay line with a replica of a load of the main delay line. A signal on the control node determines a duration of a delay of a delay element of the main delay line. Loading the control node may include driving a replica delay line at least one cycle of a system clock prior to enabling the main delay line. Driving the replica delay line may include enabling a replica clock signal generated based on the system clock signal and disabling the replica clock signal prior to driving the main delay line.

In at least one embodiment, an integrated circuit includes a delay line comprising first delay elements coupled in series and coupled to a control node. The delay line is responsive to generate a delayed version of an input clock signal. The integrated circuit includes a replica load coupled to the control node. The replica load is responsive to a replica clock signal. A signal on the control node determines a duration of a delay of each element of the first delay elements. The integrated circuit may include a first clock gating circuit configured to provide the input clock signal based on a system clock signal and in response to a first value of a control signal. The integrated circuit may include a second clock gating circuit configured to provide the replica clock signal based on the system clock signal and in response to a second value of the control signal, the second value being complementary to the first value.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
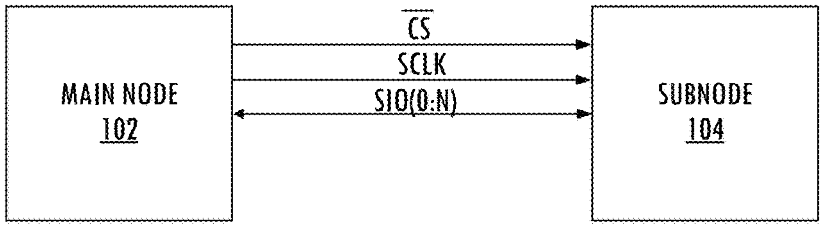
FIG. 1 illustrates a functional block diagram of an exemplary Serial Peripheral Interface (SPI).
Figure 2:
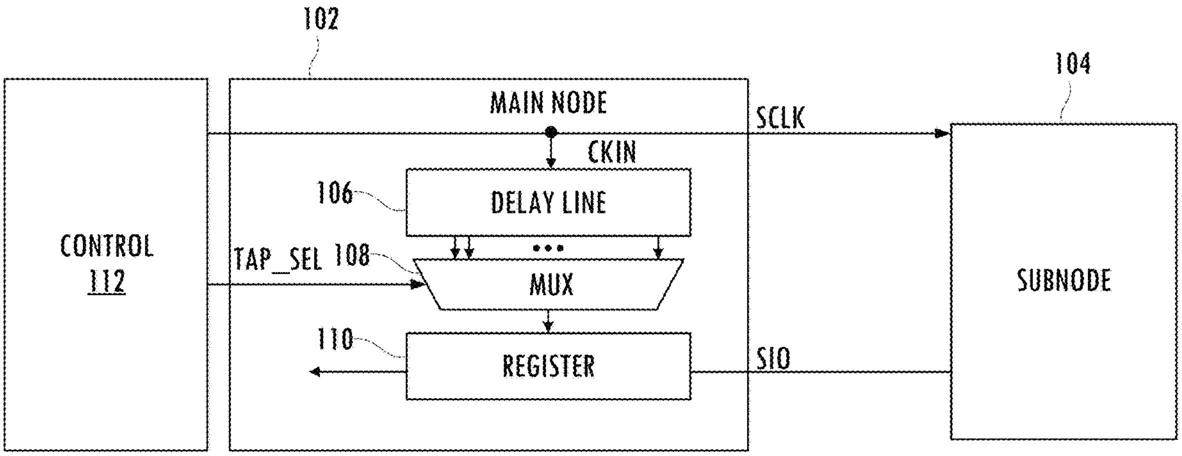
FIG. 2 illustrates a detailed functional block diagram of features of an exemplary SPI.
Figure 3:
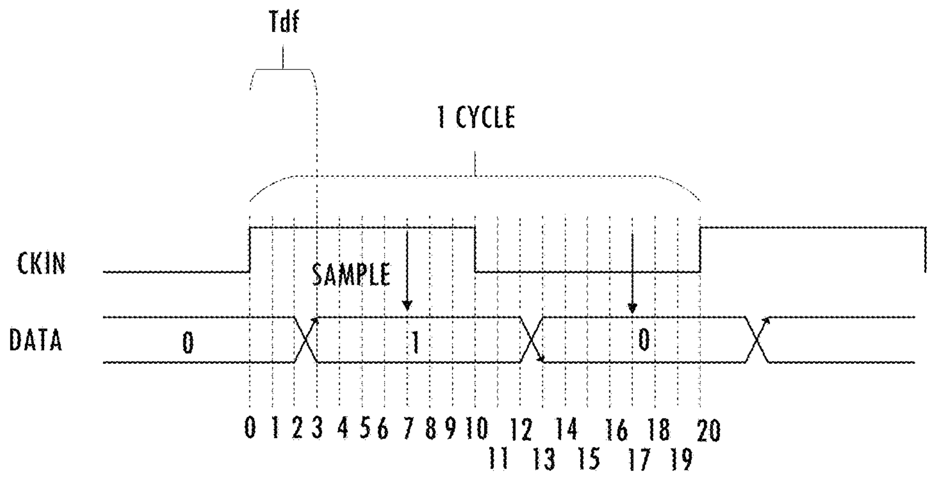
FIG. 3 illustrates waveforms for receiving data using an embodiment of an exemplary SPI.

A technique that compensates for a delay between a serial clock signal and a received data signal of an SPI uses a delay line that includes a plurality of taps that provide delayed clock signals spanning one cycle of the serial clock signal. Referring to FIGS. 1-3, main node 102 (e.g., a microcontroller) communicates with subnode 104 (e.g., a peripheral device) using an exemplary SPI, as described above. Main node 102 samples DATA, which is received on terminals SIO(0:N), using a delayed version of clock signal SCLK provided by a selected tap of delay line 106. In an embodiment, delay line 106 includes twenty taps to delay clock signal CKIN by a total of one cycle of clock signal CKIN. Control signal TAP_SEL controls multiplexer 108 to select one tap for use in sampling data received on terminals SIO(0:N) to be stored in register 110. During an initialization or training sequence of the SPI, control circuit 112 determines a value of control signal TAP_SEL that compensates for delay Taf, e.g., where Taf is the delay between a rising edge of clock signal SCLK and a corresponding value of DATA received by main node 102 on terminals SIO(0:N), to cause main node 102 to sample the corresponding value of DATA after the time it takes for the value of signal DATA to be stabilized.

Figure 4:
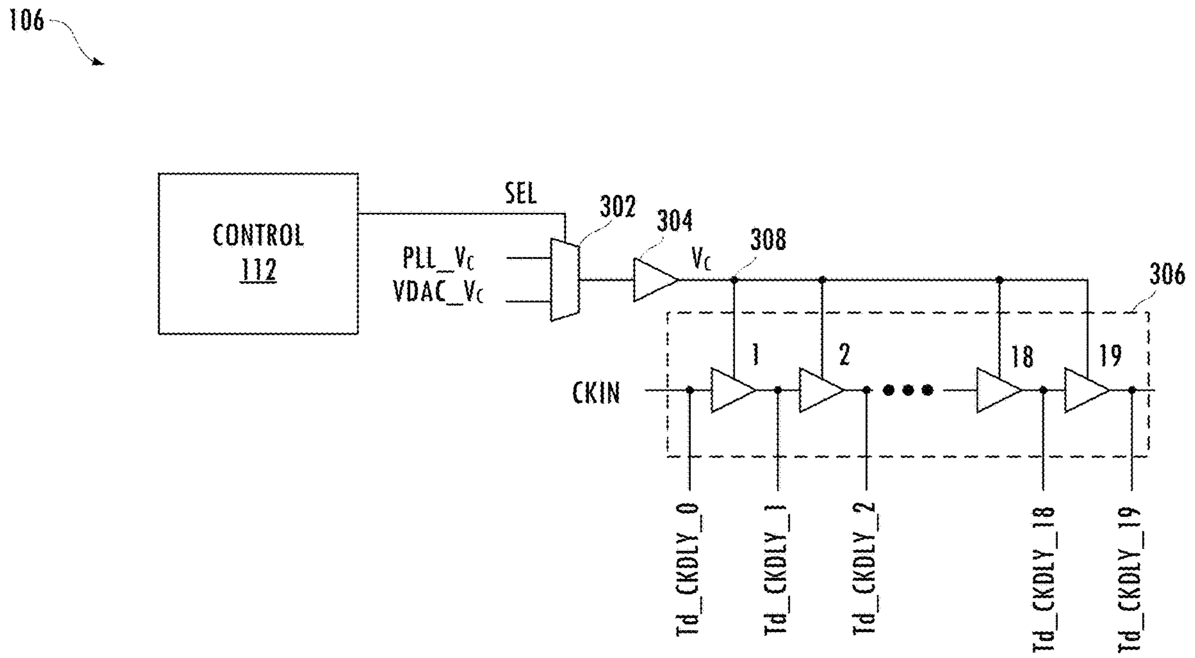
FIG. 4 illustrates a functional block diagram of an exemplary delay line for use with an SPI in an exemplary application.

Referring to FIG. 4, in at least one embodiment, delay line 106 has twenty taps associated with nineteen series-coupled delay elements of main delay line 306 that provide corresponding versions of clock signal CKIN (e.g., Td_CKDLY_0, Td_CKDLY_1, Td_CKDLY_2, . . . , Td_CKDLY_19). Each delay element provides a version of clock signal CKIN that is delayed by period $T_d$ from the prior version on the adjacent tap. In at least one embodiment, each delay element is a digital buffer circuit configured to receive control voltage VC on a power supply node (e.g., on a positive power supply terminal) that provides a delay having period Ta. However, other embodiments of delay lines use other numbers of taps and series-coupled delay elements in main delay line 306 and other embodiments of delay elements use different circuit topologies to provide a delay by period Ta, which is a delay having a duration determined by control voltage VC on a control node of the delay element. For example, a delay element having a current-mode logic circuit topology provides a delay having a period $T_d$ determined by control voltage VC provided to a bias control node of the delay element (e.g., a bias control node coupled to a current source or current sink of a current-mode logic circuit).

In at least one embodiment, a control voltage VC is a buffered version of a voltage control signal selected from control voltages received from other portions of a system according to a target application. For example, control circuit 112 generates control signal SEL according to the target application to cause multiplexer 302 to provide a control voltage selected from voltage control signal PLL_$V_C$, which is a control signal for a voltage-controlled oscillator of a phase-locked-loop, and voltage control signal VDAC_$V_C$, which is an output of a voltage digital-to-analog converter. In at least one embodiment, control circuit 112 selects voltage control signal PLL_$V_C$ in a high accuracy, high power mode of operation (e.g., high-speed SPI with constant delay over process voltage and temperature) and selects voltage control signal VDAC_$V_C$ in a low accuracy, low power mode of operation (e.g., low-speed SPI with variable delay over process voltage and temperature). In an embodiment, during power-up, control circuit 112 selects voltage control signal VDAC_$V_C$ and the low-speed SPI as a default link for communication with an external memory component (e.g., flash memory, pseudostatic random access memory, or other suitable memory). After the integrated circuit powers up, control circuit 112 selects voltage control signal PLL_$V_C$ and the high-speed SPI to communicate with the external memory component in some modes of operation. Control circuit 112 may select the low-speed SPI to reduce power consumption in some modes of operation. In an embodiment, control circuit 112 switches from the high-speed SPI to the low-speed SPI when the integrated circuit is not communicating.

In at least one embodiment, a main node generates a clock signal using a phase-locked loop having frequency $F_{VCO}$, which is proportional to voltage control signal PLL_$V_C$. Therefore, $1/T_{VCO}$ is proportional to voltage control signal PLL_$V_C$ and the phase-locked loop is designed for period $T_{VCO}$ to be equal to $10\times T_d$, where period $T_{VCO}$ is the period of a clock signal output by a voltage-controlled oscillator of the phase-locked loop. Accordingly, $1/T_d$ is proportional to control voltage $V_C$ (i.e., $T_d$ is inversely proportional to control voltage $V_C$). Clock signal CKIN is equal to $F_{VCO}/2$ so that the signals provided by twenty taps of main delay line 306 span one period of clock signal CKIN and provide twenty non-overlapping versions of clock CKIN. In other embodiments, main delay line 306 includes other numbers of taps and delay elements to provide other numbers of non-overlapping versions of clock signal CKIN that span one period of clock signal CKIN.

Figure 5:
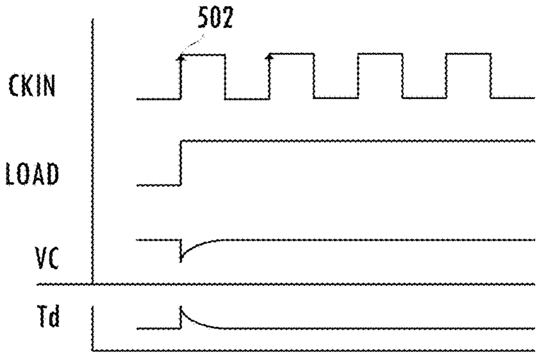
FIG. 5 illustrates waveforms for the exemplary delay line of FIG. 4.
Figure 6:
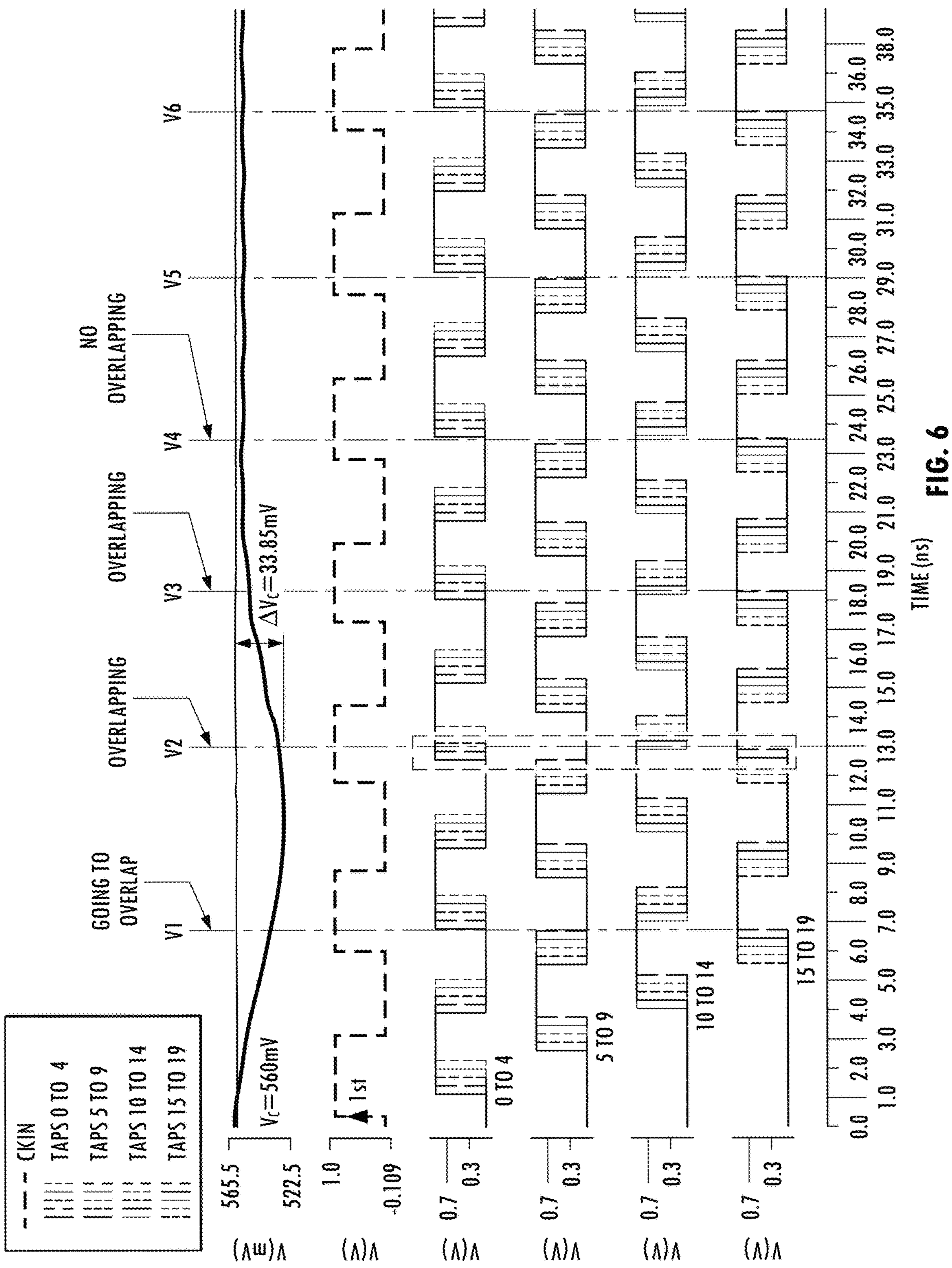
FIG. 6 illustrates waveforms for various taps of the exemplary delay line of FIG. 4.

Referring to FIGS. 4 and 5, in at least one embodiment of delay line 106, buffer 304 is a high bandwidth buffer that serves as a power supply for main delay line 306 by providing control voltage $V_C$ to each delay element in main delay line 306. Since buffer 304 is bandwidth limited, when the first edge of clock signal CKIN (e.g., edge 502) enters main delay line 306, buffer 304 experiences a sudden load on voltage control node 308 from the series-coupled delay elements (e.g., load=$M\times C\times V_C\times$freq, where M is the total number of delay elements, C is the effective capacitance of each delay element, and freq is the frequency of clock signal CKIN). That sudden load causes control voltage $V_C$ to drop by voltage drop $\Delta V_C$, which in some embodiments is a non-negligible amount (e.g., a few tens of millivolts (mV), up to 50 mV). Buffer 304 takes time to react and compensate for voltage drop $\Delta V_C$. Since period $T_d$ is inversely proportional to control voltage $V_C$, voltage drop $\Delta V_C$ corresponds to period change $\Delta T_d$ according to a corresponding gain. As control voltage $V_C$ drops, period $T_d$ increases, and the delays applied by individual delay elements of main delay line 306 are no longer equal, which may cause the taps to provide at least one version of clock signal CKIN that overlaps with another delayed version of clock signal CKIN provided by an adjacent tap. For example, period $T_d$ of the first delay element of main delay line 306 is larger than period $T_d$ of the second delay element of main delay line 306 and period $T_d$ of the second delay element of main delay line 306 is larger than period $T_d$ of the third delay element of main delay line 306. FIG. 6 illustrates overlapping taps. In the exemplary SPI application, the overlapping taps cause the data sampling position to deviate from a target position (e.g., target position SAMPLE of FIG. 3, where period $\Delta T_d$=0) and the SPI may sample signal DATA before signal DATA stabilizes, which can corrupt the recovered data before control voltage $V_C$ stabilizes. Delay line 106 takes a few cycles of clock signal CKIN for control voltage $V_C$ to recover from the sudden load and to stabilize.

A technique that reduces the effect of suddenly loading a control node when enabling a delay line used to compensate for a delay between a serial clock signal and data received in an SPI includes a fast-settling delay line that reduces to a negligible level or eliminates a corresponding voltage drop $\Delta V_C$. The techniques include loading the control node with a replica load before the first edge of clock signal CKIN (e.g., edge 502) is received by a main delay line. The replica load is equivalent to the load on the control node introduced by the main delay line in response to the first edge of the clock signal being received by the main delay line. In an embodiment, the replica load is a replica delay line that receives a replica clock signal having the same frequency as the clock signal input to the main delay line. After a few cycles of the replica clock signal, the control voltage is stable and control logic disables the replica clock signal and the replica delay line and enables the main delay line. In at least one embodiment, the control logic disables the replica clock signal prior to or concurrently with driving the main delay line. However, disabling the replica clock signal concurrently with driving the main delay line increases current consumption and causes buffer 304 to react faster (i.e., with higher bandwidth) but with increased noise in some embodiments. Some embodiments trade off low noise and high bandwidth and disable the replica clock signal prior to driving the main delay line.

Figure 7:
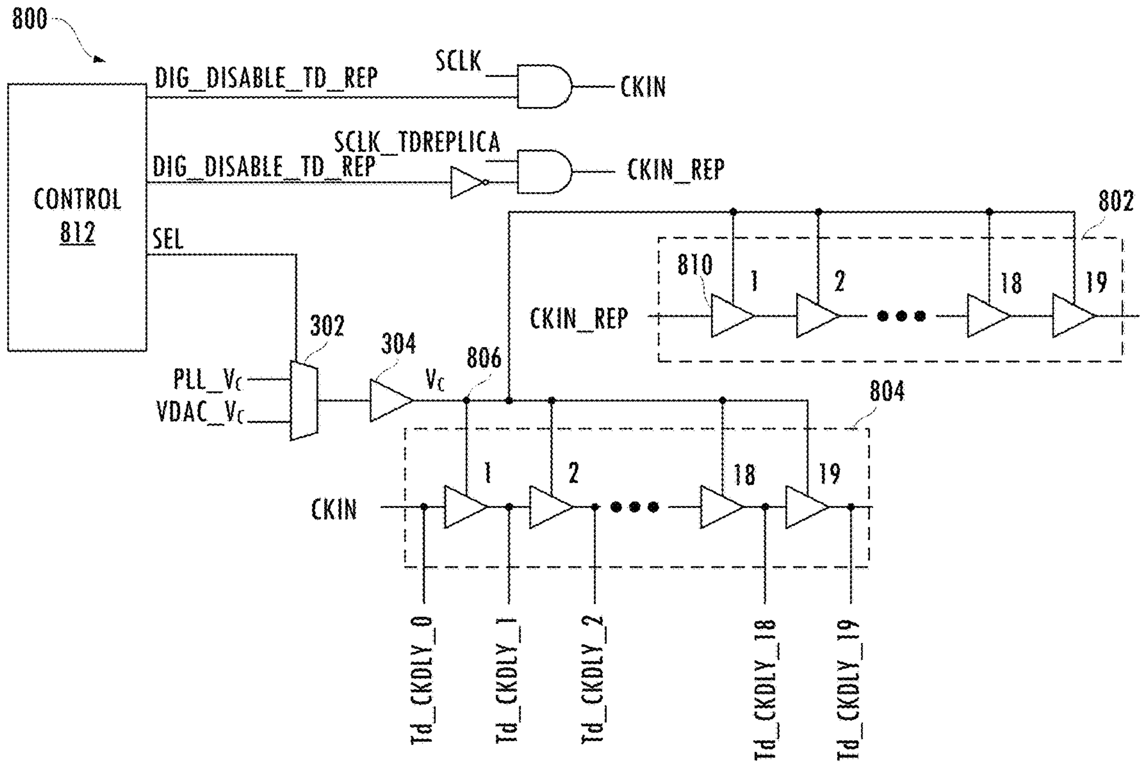
FIG. 7 illustrates a functional block diagram of an exemplary fast-settling delay line consistent with at least one embodiment of the invention.

Referring to FIG. 7, in at least one embodiment, fast-settling delay line 800 includes main delay line 804 coupled to control node 806. Main delay line 804 includes M series-coupled delay elements that each have a delay with duration of period $T_d$ and replica delay line 802 includes M series-coupled delay elements that each have a delay with a duration of period $T_d$. Control circuit 812 controls replica delay line 802 to introduce a replica load on node 806 before the first edge of clock signal CKIN is received by main delay line 804. Replica delay line 802 provides a load on control node 806 that is equivalent to the load on control node 806 introduced by main delay line 804 after the first edge of clock signal CKIN is received by main delay line 804. In an embodiment, replica delay line 802 loads node 806 when replica delay line 802 is driven by clock signal CKIN_REP. In an embodiment, clock signal CKIN_REP has the same frequency as clock signal CKIN and replica delay line 802 applies a load of $M \times C \times V_C \times freq$, where M is the total number of delay elements in replica delay line 802, C is the effective capacitance of each delay element in replica delay line 802, and freq is the frequency of clock signal CKIN_REP. After a few cycles of clock signal CKIN_REP, control voltage $V_C$ is stable and control circuit 812 switches from loading of node 806 by replica delay line 802 to loading of node 806 by main delay line 804 by disabling clock signal CKIN_REP and enabling clock signal CKIN. Enabling clock signal CKIN enables the taps of main delay line 804. In other embodiments of a replica load, replica load is equivalent to the load of main delay line 804 when clock signal CKIN is enabled, but replica delay line 802 uses $M_{REP}$ delay elements having effective capacitance $C_{REP}$, where $M_{REP}$ corresponds to a number of delay elements that is different from M, effective capacitance $C_{REP}$ is different from C of main delay line 804, and clock signal CKIN_REP has frequency freqREP that is different from the frequency of clock signal CKIN (i.e., $M \times C \times V_C \times freq = M_{REP} \times C_{REP} \times V_C \times freq_{REP}$).

In at least one embodiment, fast-settling delay line 800 generates clock signal CKIN and clock signal CKIN_REP by gating serial clock signal SCLK and a replica clock signal SCLK_TDREPLICA, which is a replica of serial clock signal SCLK. For example, serial clock signal SCLK is logically ANDed with control signal DIG_DISABLE_TD_REP and replica clock signal SCLK_TDREPLICA is logically ANDed with an inverted version of control signal DIG_DISABLE_TD_REP. However, in other embodiments, other logic gates are used to realize equivalent logical functions and may be responsive to other control signals generated by control circuit 812.

Figure 8:
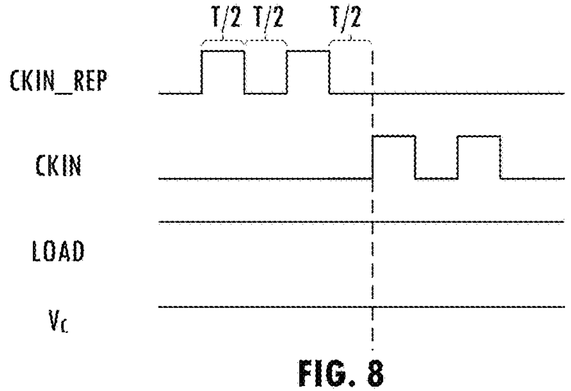
FIG. 8 illustrates waveforms for an ideal fast-settling delay line consistent with at least one embodiment of the invention.
Figure 9:
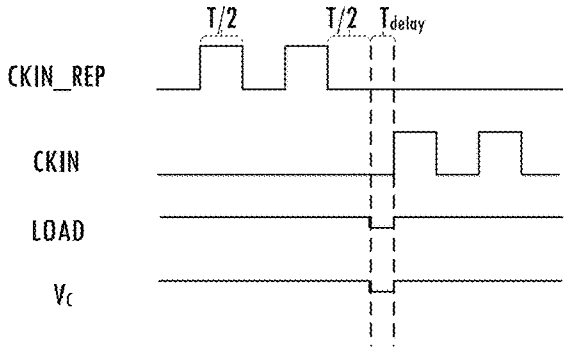
FIG. 9 illustrates waveforms for an embodiment of a fast-settling delay line having non-idealities.

Referring to FIGS. 4, 7, and 8, ideal switching from actively loading control node 806 with replica delay line 802 to actively loading control node 806 with main delay line 804 results in the first rising edge of clock signal CKIN coinciding with T/2 from the last falling edge of clock signal CKIN_REP and maintains a constant load on control node 806 and a constant control voltage $V_C$. Referring to FIGS. 7 and 9, in at least some embodiments, in practice, routing or logic propagation delay or other non-idealities cause switching from replica delay line 802 actively loading node 806 to main delay line 804 actively loading node 806 to result in a non-zero interval Tdelay between the first rising edge of clock signal CKIN and T/2 from the last falling edge of clock signal CKIN_REP. As a result, the load on control node 806 decreases by a non-zero amount and control voltage $V_C$ decreases by a corresponding amount. In some embodiments, the switching is well controlled and interval Tdelay equals zero or is negligible, causing voltage drop $\Delta V_C$, to equal zero or be negligible, accordingly. However, if interval Tdelay is less than T/2, voltage $\Delta V_C$ is less than the voltage dip in delay line 106 and less than maximum voltage drop $\Delta V_C$_MAX (e.g., +13 mV), which is the maximum voltage drop that a design can tolerate in response to variations in process, power supply, and temperature. A smaller interval Tdelay reduces voltage drop $\Delta V_C$, which improves performance of fast-settling delay line 800 as compared to delay line 106. Fast-settling delay line 800 takes fewer cycles of clock signal CKIN for control voltage $V_C$ to recover and to stabilize in response to enabling main delay line 804.

Figure 10:
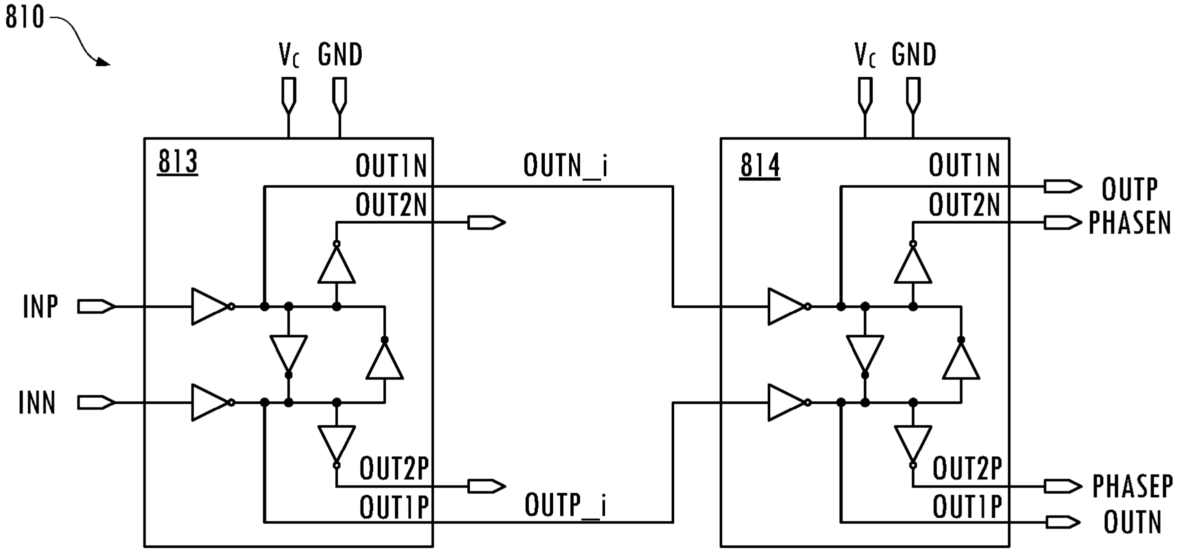
FIG. 10 illustrates a functional block diagram of an embodiment of a delay element consistent with at least one embodiment of the invention.
Figure 11:
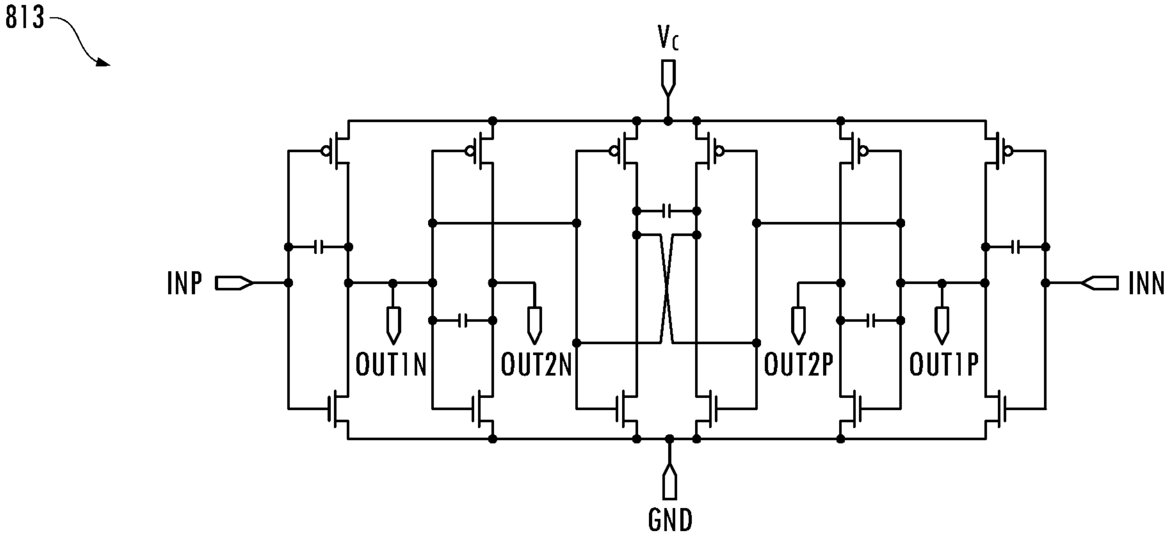
FIG. 11 illustrates a circuit diagram of an embodiment of a half-unit delay element consistent with at least one embodiment of the invention.

Referring to FIGS. 10 and 11, in at least one embodiment, replica delay line 802 and main delay line 804 include M series-coupled instantiations of delay element 810, where each instantiation of delay element 810 includes half-delay element 813 coupled in series to half-delay element 814, which in an embodiment is another instantiation of the circuit for half-delay element 813. Each half-delay element receives two input signals (e.g., INP and INN) and provides four output signals (e.g., OUT1P, OUT2P, OUT1N, and OUT2N). Output signals of each half-delay element drive a next half-delay element or other circuit, or are used as phase signals (e.g., PHASEP and PHASEN) that are distinct from the signals driving the next delay element or other circuit. Other logic circuits or circuit topologies may be used to implement delay element 810.

Figure 12:
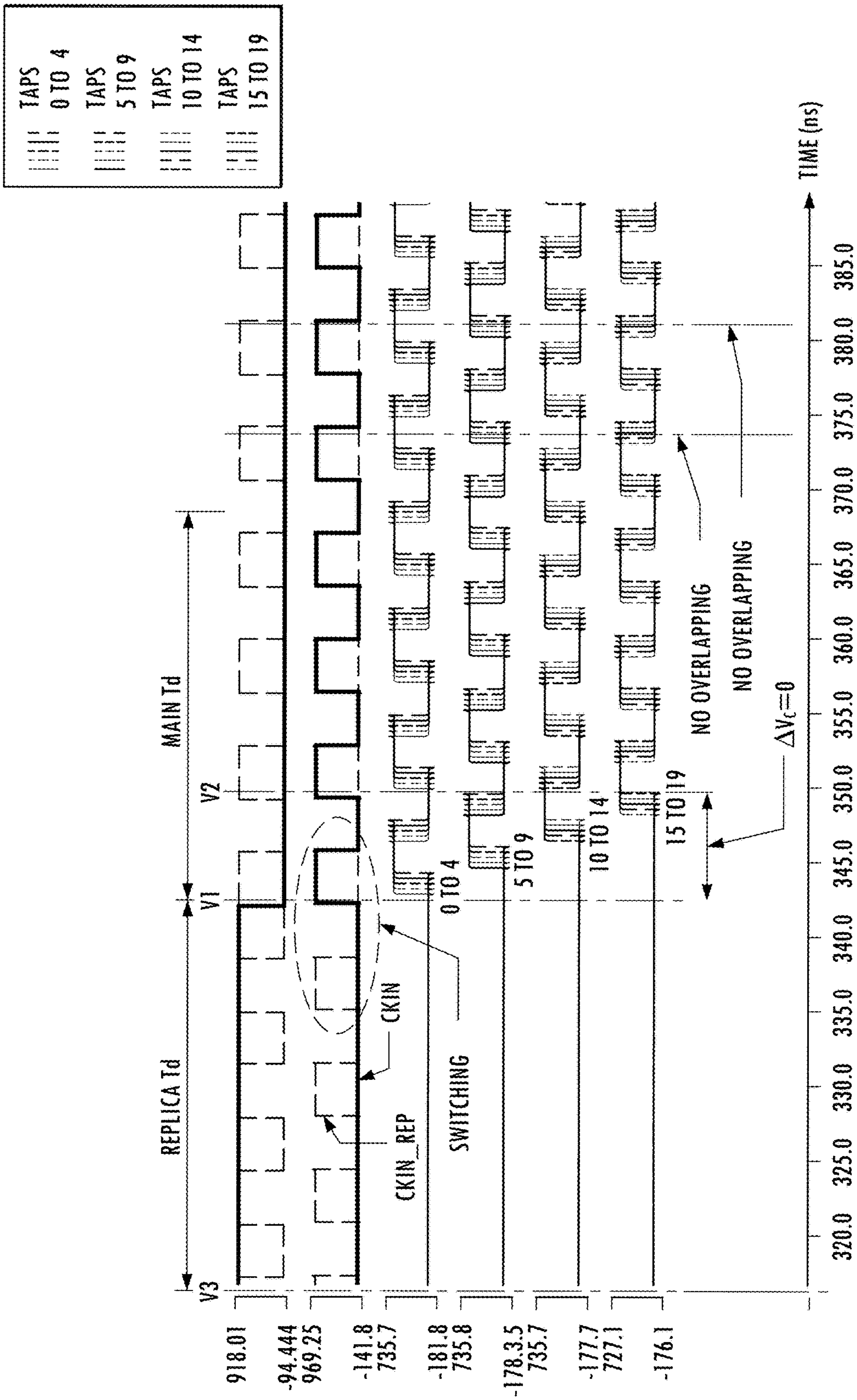
FIG. 12 illustrates waveforms for various taps of a fast-settling delay line.
Figure 13:
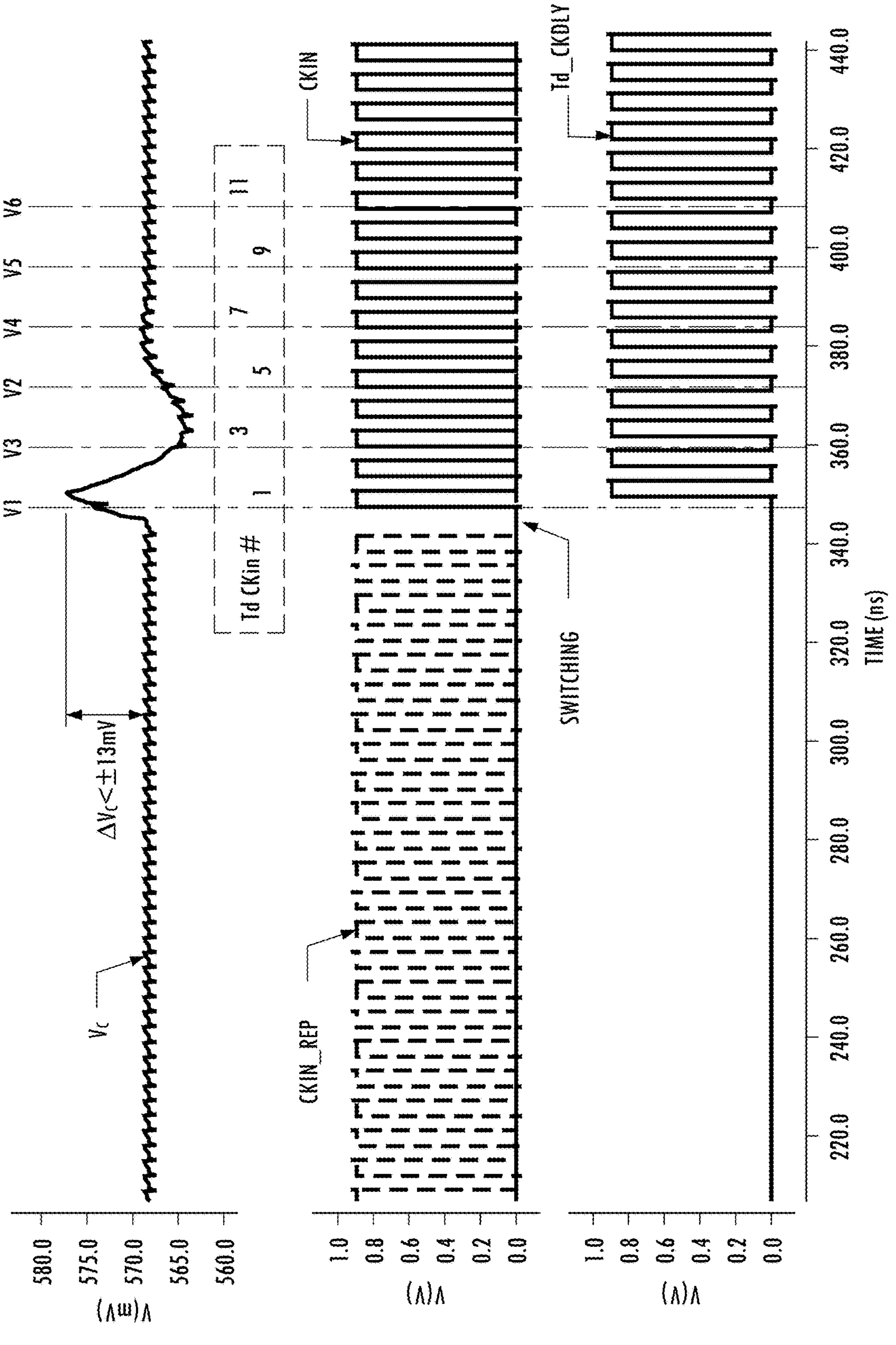
FIG. 13 illustrates waveforms for a fast-settling delay line switching from the replica delay to the main delay line consistent with at least one embodiment of the invention.

FIG. 12 illustrates a fast-settling delay line switching from loading the control node with a replica load to loading the control node with the main delay line at approximately 342.5 ns, where period Tdelay equals zero, the load remains constant during switching (i.e., $\Delta V_C=0$), and taps 0, 1, 2, . . . , 19 generated by main delay line 804 are non-overlapping. FIG. 13 illustrates control voltage $V_C$, CKIN and CKIN_REP, and a selected phase output Td_CKDLY of main delay line 804 in response to switching from loading the control node with a replica load to enabling the main delay line at approximately 342.5 ns, where interval $T_{delay}$ equals T/2 and voltage drop $\Delta V_C$ equals maximum tolerable voltage $\Delta V_{C\_MAX}$.

Thus, fast-settling delay line techniques have been described. The description of the invention set forth herein is illustrative and is not intended to limit the scope of the invention as set forth in the following claims. For example, while the invention has been described in an embodiment in which a fast-settling delay line includes a main delay line and a replica delay line for use in a serial peripheral interface application, one of skill in the art will appreciate that the teachings herein can be utilized in other applications. The terms “first,” “second,” “third,” and so forth, as used in the claims, unless otherwise clear by context, are to distinguish between different items in the claims and do not otherwise indicate or imply any order in time, location or quality. For example, "a first received signal" and "a second received signal," do not indicate or imply that the first received signal occurs in time before the second received signal. Variations and modifications of the embodiments disclosed herein may be made based on the description set forth herein, without departing from the scope of the invention as set forth in the following claims.

What is claimed is:

1. An integrated circuit comprising:

a main delay line comprising first delay elements coupled in series and coupled to a control node, the main delay line being responsive to generate a delayed version of an input clock signal;

a replica load coupled to the control node, the replica load being responsive to a replica clock signal; and a select circuit configured to provide a first control voltage to the control node in response to a corresponding value of a selection signal and to provide a second control voltage to the control node in response to a corresponding second value of the selection signal, wherein a signal on the control node determines a duration of a delay of each element of the first delay elements.

2. The integrated circuit as recited in claim 1 wherein the selection signal is determined based on a speed of a communications link using the delayed version of the input clock signal.

3. The integrated circuit as recited in claim 1 wherein the input clock signal is based on a system clock signal and the replica clock signal is based on a replica of the system clock signal.

4. The integrated circuit as recited in claim 3 further comprising:

a first clock gating circuit configured to provide the input clock signal based on the system clock signal and in response to a first value of a control signal.

5. The integrated circuit as recited in claim 3 further comprising:

a serial interface circuit configured to sample received data using the delayed version of the input clock signal selected from a plurality of signals on a plurality of taps of the main delay line.

6. The integrated circuit as recited in claim 5 wherein the plurality of taps provide a plurality of non-overlapping delayed versions of the input clock signal.

7. The integrated circuit as recited in claim 4 further comprising:

a control circuit configured to set the control signal to the first value after loading the control node with the replica load.

8. The integrated circuit as recited in claim 1 wherein the replica load comprises a replica delay line having second delay elements coupled in series and coupled to the control node.

9. The integrated circuit as recited in claim 8 wherein the second delay elements and the first delay elements include different numbers of delay elements.

10. The integrated circuit as recited in claim 1 further comprising:

a buffer configured to provide a control voltage on the control node.

11. The integrated circuit as recited in claim 1 further comprising:

a serial interface circuit configured to sample received data using the delayed version of the input clock signal selected from a plurality of signals on a plurality of taps of the main delay line.

12. The integrated circuit as recited in claim 1 further comprising:

a control circuit configured to enable the main delay line after loading the control node with the replica load.

13. The integrated circuit as recited in claim 1 further comprising:

a buffer configured to provide a control voltage on the control node, wherein the replica load comprises a replica delay line having second delay elements coupled in series and coupled to the control node.

14. An integrated circuit comprising:

a main delay line comprising first delay elements coupled in series and coupled to a control node, the main delay line being responsive to generate a delayed version of an input clock signal;

a replica load coupled to the control node, the replica load being responsive to a replica clock signal;

a first clock gating circuit configured to provide the input clock signal based on a system clock signal and in response to a first value of a control signal; and a second clock gating circuit configured to provide the replica clock signal based on the system clock signal and in response to a second value of the control signal, the second value being complementary to the first value, wherein a signal on the control node determines a duration of a delay of each element of the first delay elements.

15. The integrated circuit as recited in claim 14 further comprising:

a serial interface circuit configured to sample received data using the delayed version of the input clock signal selected from a plurality of signals on a plurality of taps of the main delay line.

16. The integrated circuit as recited in claim 15 wherein the plurality of taps provides a plurality of non-overlapping delayed versions of the input clock signal.

17. The integrated circuit as recited in claim 14 further comprising:

a control circuit configured to set the control signal to the first value after loading the control node with the replica load.

18. The integrated circuit as recited in claim 14 wherein the replica load comprises a replica delay line having second delay elements coupled in series and coupled to the control node.

19. The integrated circuit as recited in claim 18 wherein the second delay elements and the first delay elements include different numbers of delay elements.

20. The integrated circuit as recited in claim 14 further comprising:

a buffer configured to provide a control voltage on the control node.

* * * * *